United States Patent [19]
Nagao et al.

[11] Patent Number: 6,051,954
[45] Date of Patent: Apr. 18, 2000

[54] CHARGE CONTROL APPARATUS

[75] Inventors: Yoshitaka Nagao; Nobuyoshi Takehara, both of Kyoto-fu, Japan

[73] Assignee: Canon Kabushiki Kaisha, Tokyo, Japan

[21] Appl. No.: 09/086,796

[22] Filed: May 29, 1998

[30] Foreign Application Priority Data

May 30, 1997 [JP] Japan .................................. 9-141250

[51] Int. Cl.$^7$ ...................................................... H02J 7/00
[52] U.S. Cl. .......................................... 320/101; 320/136
[58] Field of Search .................................... 320/101, 136, 320/138, 139; 363/79, 299

[56] References Cited

U.S. PATENT DOCUMENTS

| | | | |
|---|---|---|---|
| 3,596,218 | 7/1971 | Layton | 335/17 |
| 3,596,219 | 7/1971 | Erickson | 335/17 |
| 4,466,071 | 8/1984 | Russell, Jr. | 364/528.28 |
| 4,658,322 | 4/1987 | Rivera | 361/37 |
| 4,661,758 | 4/1987 | Whittaker | 320/101 |
| 4,847,850 | 7/1989 | Kafka et al. | 372/71 |
| 4,878,144 | 10/1989 | Nebon | 361/96 |
| 4,931,894 | 6/1990 | Legatti | 361/45 |
| 5,121,282 | 6/1992 | White | 361/42 |
| 5,185,684 | 2/1993 | Beihoff et al. | 361/45 |
| 5,185,685 | 2/1993 | Tennies et al. | 361/45 |
| 5,185,686 | 2/1993 | Hansen et al. | 361/45 |
| 5,185,687 | 2/1993 | Beihoff et al. | 361/45 |
| 5,206,596 | 4/1993 | Beihoff et al. | 324/536 |
| 5,208,542 | 5/1993 | Tennies et al. | 324/544 |
| 5,223,682 | 6/1993 | Pham et al. | 218/63 |
| 5,224,006 | 6/1993 | MacKenzie et al. | 361/45 |
| 5,245,498 | 9/1993 | Uchida et al. | 361/47 |
| 5,270,636 | 12/1993 | Lafferty | 320/101 |
| 5,307,230 | 4/1994 | MacKenzie | 361/96 |
| 5,359,293 | 10/1994 | Boksiner et al. | 324/544 |
| 5,420,740 | 5/1995 | MacKenzie et al. | 361/45 |
| 5,432,455 | 7/1995 | Blades | 324/536 |
| 5,434,509 | 7/1995 | Blades | 324/536 |
| 5,452,223 | 9/1995 | Zuercher et al. | 324/102 |
| 5,453,723 | 9/1995 | Fello et al. | 335/18 |
| 5,459,630 | 10/1995 | MacKenzie et al. | 324/520 |
| 5,483,211 | 1/1996 | Carrodus et al. | 335/18 |
| 5,493,278 | 2/1996 | Mackenzie et al. | 340/638 |
| 5,510,946 | 4/1996 | Franklin | 361/56 |
| 5,519,561 | 5/1996 | Mrenna et al. | 361/105 |
| 5,546,266 | 8/1996 | Mackenzie et al. | 361/93 |
| 5,550,751 | 8/1996 | Russell | 364/528.28 |
| 5,561,605 | 10/1996 | Zuercher et al. | 702/64 |
| 5,578,931 | 11/1996 | Russell et al. | 324/536 |
| 5,590,012 | 12/1996 | Dollar, II | 361/113 |
| 5,600,526 | 2/1997 | Russell et al. | 361/65 |
| 5,654,883 | 8/1997 | Takehara et al. | 363/79 |
| 5,659,453 | 8/1997 | Russell et al. | 361/93.1 |
| 5,682,305 | 10/1997 | Kurokami et al. | 363/79 |
| 5,714,869 | 2/1998 | Tamechika et al. | 320/101 |
| 5,831,500 | 11/1998 | Turner et al. | 335/17 |
| 5,838,148 | 11/1998 | Kurokami et al. | 323/299 |

FOREIGN PATENT DOCUMENTS

| | | |
|---|---|---|
| 55-127075 | 10/1980 | Japan . |
| 6-67135 | 8/1994 | Japan . |

*Primary Examiner*—Peter S. Wong
*Assistant Examiner*—Lawrence Luk
*Attorney, Agent, or Firm*—Fitzpatrick, Cella Harper & Scinto

[57] ABSTRACT

The control unit of a charge control apparatus for controlling charge of a storage battery connected in parallel to a solar cell panel has a voltage detector and a reference voltage generator for generating a reference voltage, both of which are connected in parallel to the storage battery, a delay device for delaying the output signal from the voltage detector by a predetermined time, and a comparator for comparing the signal delayed by the delay device with a reference signal generated by the reference voltage generator and controlling, in accordance with the comparison result, opening/closing of a switch for short-circuiting the output from the solar cell panel. With this simple arrangement, devices in the charge control apparatus can be protected even when the storage battery is disconnected for maintenance or the like.

14 Claims, 10 Drawing Sheets

CHARGE CONTROL APPARATUS

BACKGROUND OF THE INVENTION

1. Field of the Invention

The present invention relates to a charge control apparatus and, more particularly, to a charge control apparatus which can appropriately store power generated by a solar cell in a storage battery and protect devices in the apparatus even in maintenance such as exchange of the storage battery.

2. Description of Related Art

In recent years, global warming, exhaustion of fossil fuels, radioactive contamination due to nuclear accidents and radioactive wastes pose problems, and awareness of the terrestrial environment and energy is rapidly growing. Under these circumstances, a solar cell which generates power from solar radiation as an inexhaustible and clean energy source is expected.

Systems using a solar cell have a variety of scales from several W to several thousand kW. The types of systems are also rich in variety, and there are a system which directly uses power generated by a solar cell, a system which stores power in a battery, a system which uses both the photovoltaic power and a commercial power source, and the like. Of these systems, the system which stores power generated by the solar cell in a battery is often connected to a charge control apparatus for controlling charge of the battery such that the battery performance can be maintained for a long period.

Figure 4:
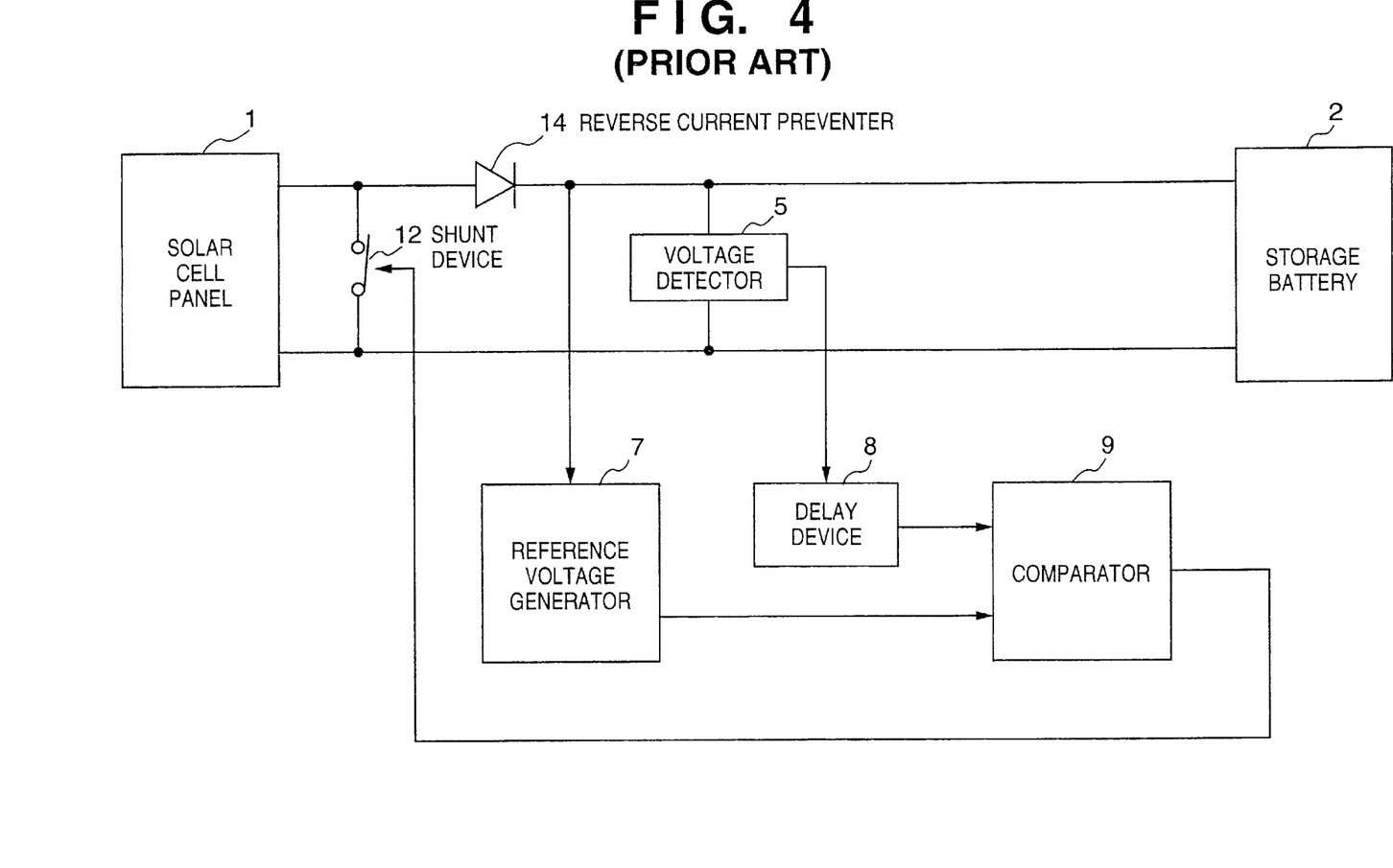
FIG. 4 is a block diagram showing an arrangement of a charge control apparatus.
Figure 5:
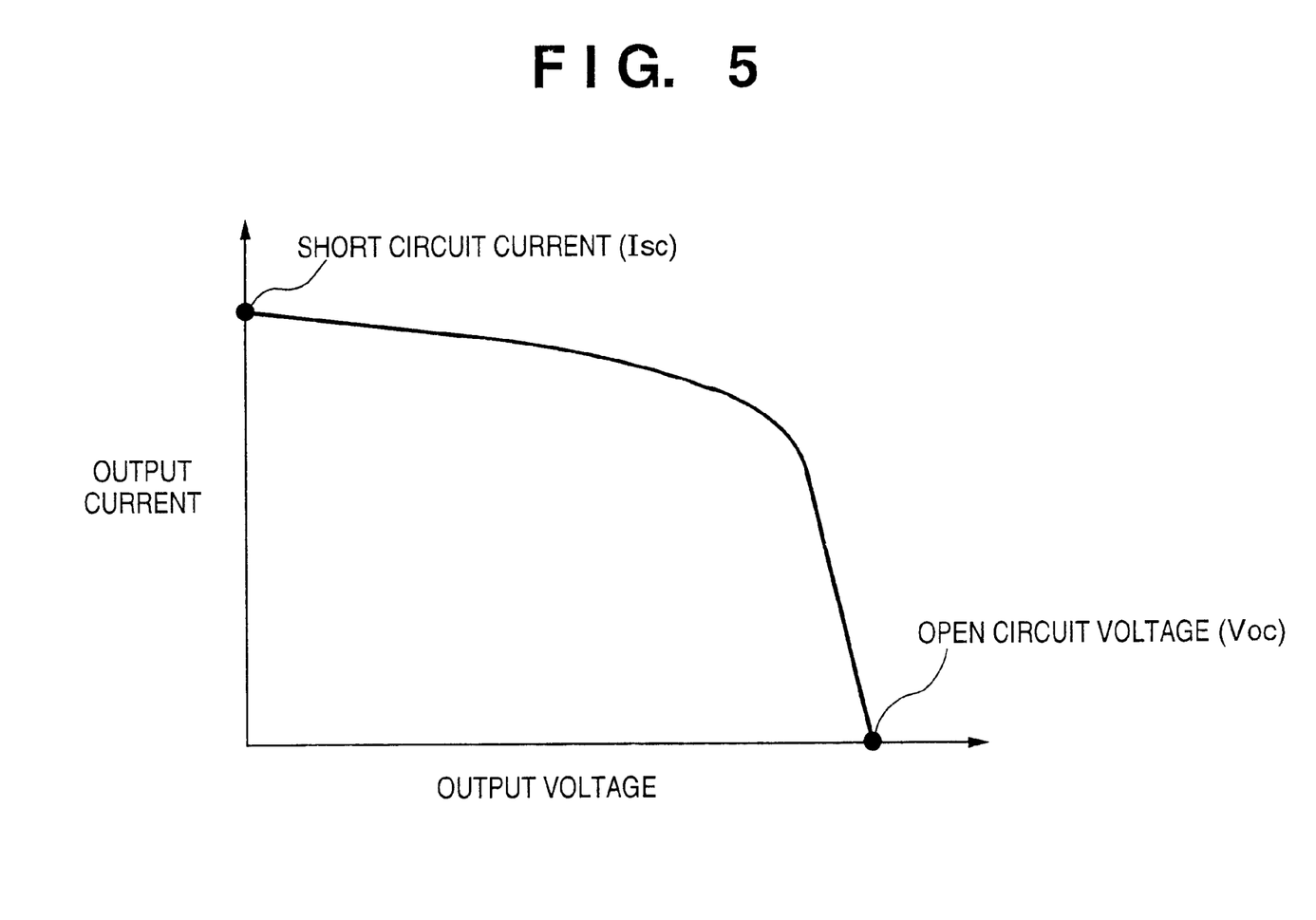
FIG. 5 is a graph showing the relationship between the output voltage and the output current from a solar cell.

FIG. 4 shows an example of such a charge circuit having a charge control function, which is disclosed in Japanese Patent Laid-Open No. 55-127075. Referring to FIG. 4, reference numeral 1 denotes a solar cell panel; 2, a storage battery as a secondary battery; 5, a voltage detector; 7, a reference voltage generator; 9, a comparator; 12, a shunt; and 14, a reverse current preventer. Power generated by the solar cell panel 1 is stored in the storage battery 2. At this time, the comparator 9 is used to compare a signal obtained upon detecting the terminal voltage of the storage battery 2 by the voltage detector 5 with a signal generated by the reference voltage generator 7. If the voltage of the storage battery 2 exceeds a predetermined value, the shunt 12 is operated to short-circuit the output from the solar cell panel 1. However, the charge circuit shown in FIG. 4 has the following problems. The solar cell panel 1 has the voltage-current characteristics as shown in FIG. 5. For this reason, when the storage battery 2 is exchanged or a cable to the storage battery 2 is disconnected in the charge circuit shown in FIG. 4, the open circuit voltage of the solar cell panel 1 is applied to the voltage detector 5. Since this voltage is higher than the above-described predetermined voltage which causes short circuit of the output from the solar cell panel 1, it is determined that the storage battery 2 is overcharged. As a result, the shunt 12 operates on the basis of the output from the comparator 9 to short-circuit the output from the solar cell panel 1. At this time, the output voltage from the solar cell panel 1 abruptly lowers. The comparator 9 determines that the overcharged state is canceled, and the short-circuited state by the shunt 12 is canceled. Alternatively, when power supply is stopped, the closed state of the shunt 12 cannot be maintained, and the short-circuited state by the shunt 12 is canceled. The open circuit voltage is applied to the voltage detector 5 again. The above-described short-circuit operation and short-circuit canceling operation, i.e., the opening and closing operations of the shunt 12 are repeated. When such a kind of oscillation is repeated, constituent components such as a transistor used for the shunt 12 may generate heat and be damaged, as will be described later in detail. In addition, when a relay is used as the shunt 12, the electric contact may be degraded or seized in a short time upon repeating the opening and closing operations.

Figure 6:
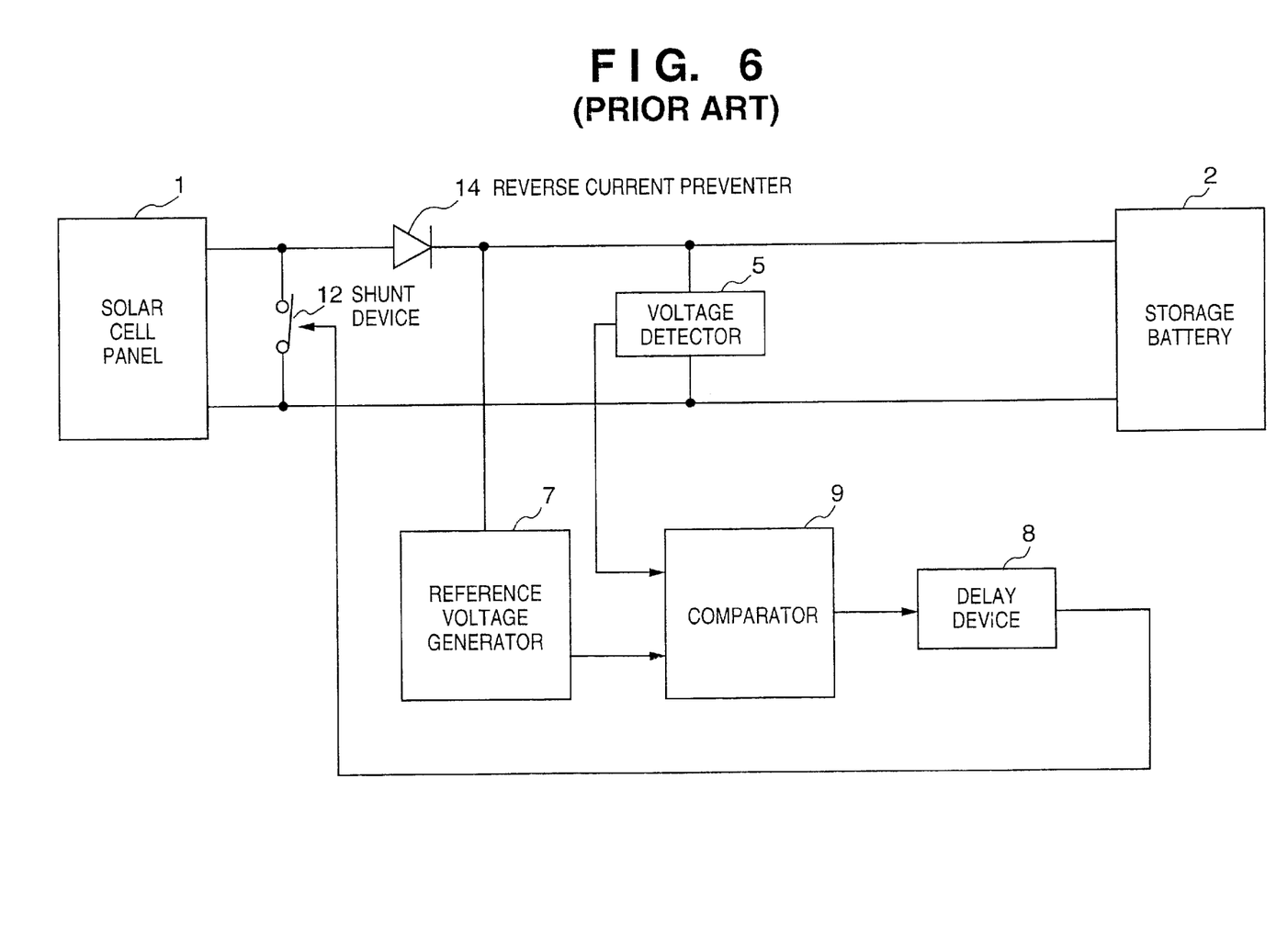
FIG. 6 is a block diagram showing another arrangement of the charge control apparatus.

FIG. 6 shows a charge circuit capable of avoiding the above disadvantages and preventing damage to devices constituting the shunt 12, which is disclosed in Japanese Patent Publication No. 6-67135. Referring to FIG. 6, reference numeral 8 denotes a delay device, and the remaining parts are the same as those in FIG. 4.

As the characteristic feature of the circuit shown in FIG. 6, the delay device 8 is inserted between the differential amplification section as the comparator 9 and the shunt 12 to set a delay time from the operation of the comparator 9 to the operation of the shunt 12. By setting the delay time, the repeating period of opening and closing of the shunt 12 becomes longer than that of the circuit shown in FIG. 4. Loss or heat of the transistor and the like constituting the shunt 12 is decreased, so damage to the transistor and the like can be prevented. In the circuit shown in FIG. 6, however, the number of components of the circuit increases because of addition of the delay device 8.

Causes for the loss and heat will be described next. In the charge circuit shown in FIG. 4 or 6, the comparator 9 and the reference voltage generator 7 often share the power supply of the control circuit, and the power supply of the control circuit often has a capacitor having a relatively large electrostatic capacitance. In this case, even when the output from the solar cell panel 1 is short-circuited, the power supply voltage of the control circuit does not immediately lower, and the reference voltage to be supplied to the comparator 9 does not immediately lower, either. On the other hand, when the shunt 12 using an active element such as a transistor, a control loop is formed through voltage detector 5-comparator 9-shunt 12-reverse current preventer 14-voltage detector 5, thus a regulator so called a shunt regulator is formed. Therefore, a voltage Vs proportional to the voltage Vr to be supplied to the comparator 9 as the reference voltage is supplied across the voltage detector 5 from the solar cell panel 1. However, the reverse current preventer 14 is biased in a reverse direction, for some time, by voltage Vc stored in the capacitor of the control circuit. That is, the above control loop is not formed in a period that the reverse current preventer 14 is biased in the reverse direction, thus a voltage applied across the shunt 12 is to approximately zero volt thereby a transistor as the shunt 12 operates in a switching mode.

Later, the voltage Vc and Vr are declined, and then a relationship Vs>Vc is formed at sometime. Since, the control circuit and the shunt 12 operate as the shunt regulator, thus the voltage supplied across the shunt 12 is locked into Vs.

Figure 7:
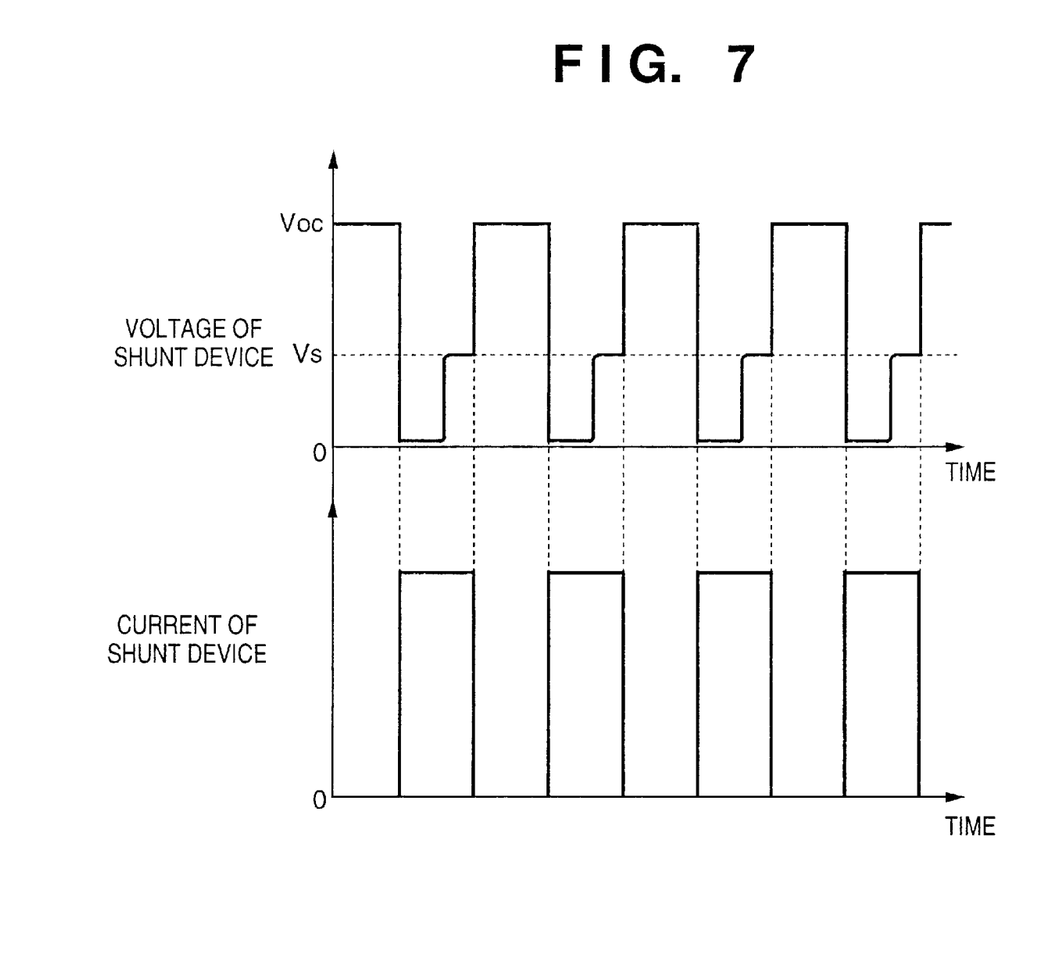
FIG. 7 is a graph showing the relationship between a voltage applied across a shunt in the photovoltaic power generation apparatus and a current flowing to the shunt.

As shown in FIG. 7, while the shunt 12 is closed, the voltage Vs is applied to the transistor as a switching element of the shunt 12, and at the same time, a current flows to generate a loss. Therefore, the transistor as a switching element generates heat. Note that Voc in FIG. 7 represents the open circuit voltage.

The loss and heat increase as the opening/closing period of the shunt 12 becomes short, as a matter of course. In addition, when the storage battery 2 is connected, the control loop is not formed because of the reverse current preventer 14 which is reverse-biased. Only a low voltage is applied to the transistor of the shunt 12, so neither loss nor heat is generated.

Therefore, in the charge control apparatus shown in FIG. 4 or 6, a sufficient heat dissipation member or structure is required in consideration of not the normal operation but maintenance such as exchange of the storage battery 2 and disconnection. The heat dissipation member or structure increases the cost of the apparatus.

SUMMARY OF THE INVENTION

The present invention has been made to solve the above problem, and has as its object to provide a charge control apparatus which can protect devices in the apparatus using a simple structure even when no storage battery is connected because of maintenance or the like.

In order to achieve the above object, according to an aspect of the present invention, there is provided a charge control apparatus for controlling charge of a storage battery connected in parallel to a solar cell, comprising a reverse current preventer connected between said solar cell and said storage battery to prevent a current from flowing from said storage battery to said solar cell; a switch connected between said solar cell and said reverse current preventer to be parallel to said solar cell; a voltage detector and a reference voltage generator for generating a reference voltage, both of which are connected between said reverse current preventer and said storage battery to be parallel to said storage battery; a delay device for delaying an output signal from said voltage detector by a predetermined time; and a controller for comparing the signal delayed by said delay device with a reference signal generated by said reference voltage generator and controlling opening/closing of said switch in accordance with a comparison result.

According to another aspect of the present invention, there is provided a photovoltaic power generation apparatus having a solar cell, a storage battery connected in parallel to said solar cell, and a charge control unit for controlling charge of said storage battery, wherein said charge control unit comprises: a reverse current preventer connected between said solar cell and said storage battery to prevent a current from flowing from said storage battery to said solar cell; a shunt connected between said solar cell and said reverse current preventer to be parallel to said solar cell; a voltage detector and a reference voltage generator for generating a reference voltage, both of which are connected between said reverse current preventer and said storage battery to be parallel to said storage battery; a delay device for delaying an output signal from said voltage detector by a predetermined time; and a controller for comparing the signal delayed by said delay device with a reference signal generated by said reference voltage generator and controlling opening/closing of said shunt in accordance with a comparison result.

Other features and advantages of the present invention will be apparent from the following description taken in conjunction with the accompanying drawings, in which like reference characters designate the same or similar parts throughout the figures thereof.

DETAILED DESCRIPTION OF THE PREFERRED EMBODIMENTS

Preferred embodiments of a charge control apparatus of the present invention will be described below with reference to the accompanying drawings.

Figure 1:
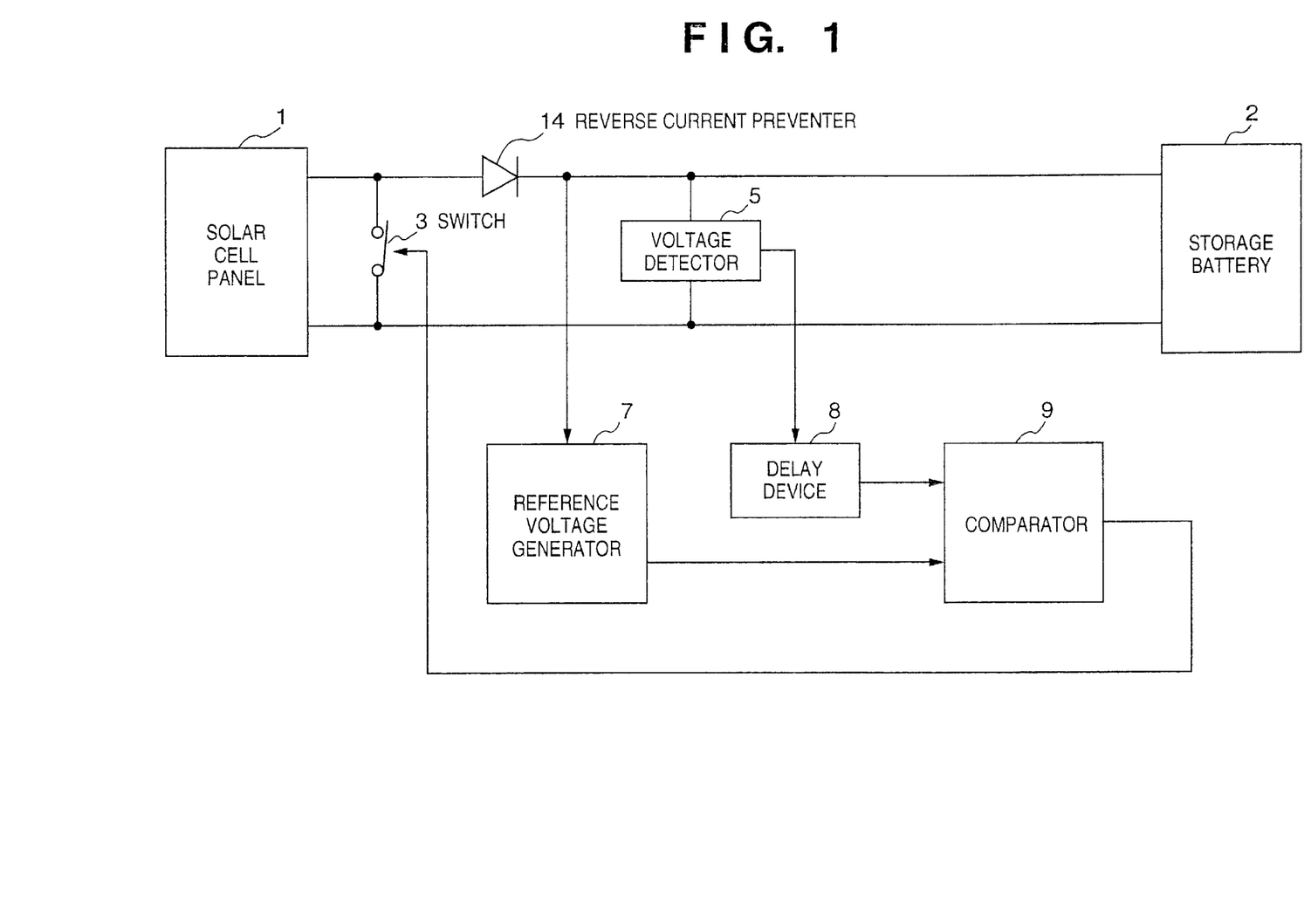
FIGS. 1 to 3 are block diagrams showing the arrangement of a charge control apparatus according to the present invention.
Figure 2:
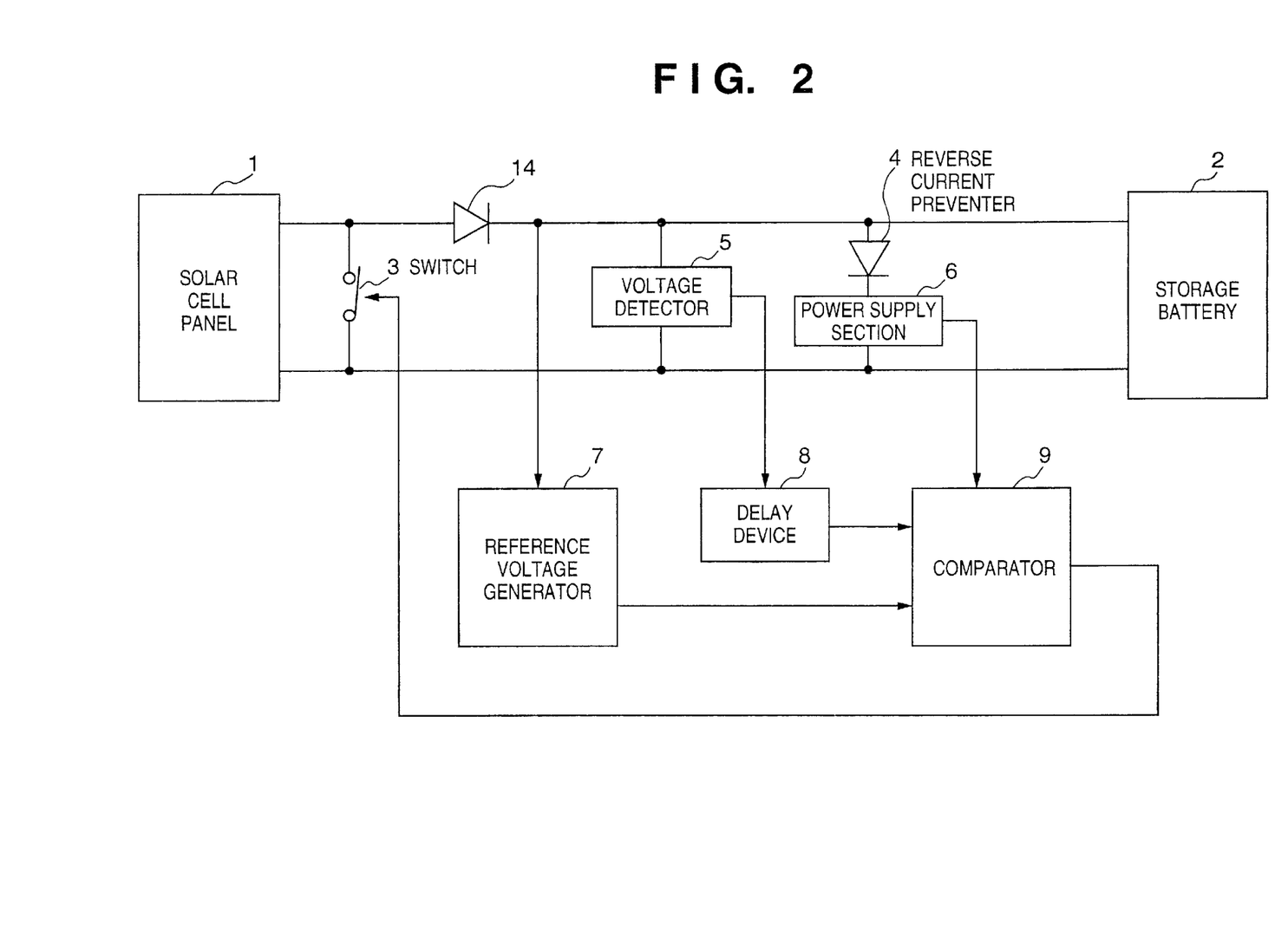
Figure 3:
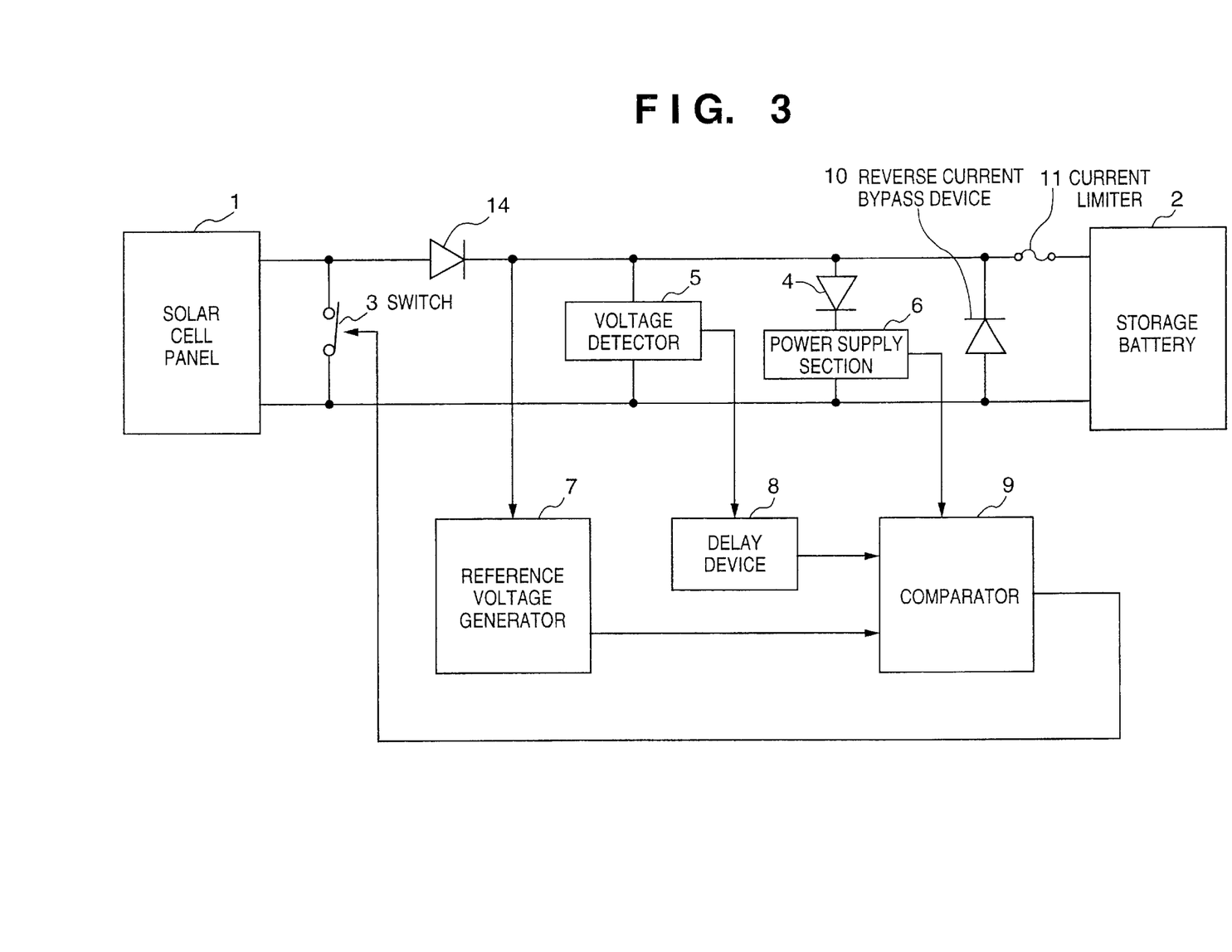

FIG. 1 is a block diagram showing an arrangement of a charge control apparatus according to the present invention. FIGS. 2 and 3 are block diagrams showing another arrangement of the charge control apparatus according to the present invention.

In FIGS. 1 to 3, reference numeral 1 denotes a solar cell panel; 2, a storage battery; 3, a switch; 4 and 14, reverse current preventers; 5, a voltage detector; 6, a power supply section; 7, a reference voltage generator; 8, a delay device; 9, a comparator; 10, a reverse current bypass device, and 11, a current limiter. These parts will be described first.

[Solar Cell]

In the present invention, a solar cell using, e.g., amorphous silicon, micro-crystallized silicon, polysilicon, single-crystal silicon, or a compound semiconductor can be used. Normally, the solar cell panel 1 has an array or string in which a plurality of solar cell modules are combined in serial and parallel to obtain a desired voltage and power.

[Storage Battery]

The storage battery 2 used in the present invention is a secondary battery. A lead storage battery, a nickel-hydrogen battery, a lithium-ion battery, or an electric double layer capacitor can be used. The storage battery is selected in consideration of the scale of the system and the storage capacity. As advantages, the lead storage battery is inexpensive, the nickel-hydrogen battery allowing deep discharge is compact and has a long service life, and the electric double layer capacitor has a semi-permanent service life.

The terminal voltage of the storage battery 2 can substantially be set in correspondence with the maximum output point voltage of the solar cell panel 1.

[Switch]

As the switch 3, any switching element such as a relay, a solid-state relay, a transistor, a MOSFET, or a GTO (Gate Turn-Off thyristor) can be used as far as it allows an opening/closing operation according to an external signal, and the current capacity or breakdown voltage can withstand the short circuit current or open circuit voltage of the solar cell panel 1. Especially, a MOSFET as a voltage control device is easy to handle.

[Reverse Current Preventer and Reverse Current Bypass Device]

The reverse current preventers 4 and 14 prevent a reverse current from the storage battery 2 to the solar cell panel 1 or a reverse current from the power supply section 6 (to be described later) to devices other than the comparator 9 (to be described later). The reverse current bypass device 10 is used to flow a current only when the storage battery 2 is connected with its polarities being reversed. More specifically, a rectifier such as a rectifier diode or a Schottky barrier diode can be used. In a low-voltage system, a Schottky barrier diode is preferably used in consideration of a loss due to a forward voltage drop. In a high-voltage system, a rectifier diode is preferably used in consideration of the breakdown voltage. Particularly, as the reverse current bypass device 10, a device withstanding a high surge current is preferable since the short circuit current of the storage battery 2 instantaneously flows to the reverse current bypass device 10.

[Voltage Detector]

As the voltage detector 5, an operational amplifier is used. In consideration of the input voltage, the terminal voltage of the storage battery 2 is appropriately divided, and the divided voltage signal is used as an input signal. In this case, the resistance of the voltage divider need be appropriately selected in consideration of the voltage of the detection terminal and the rated power of the resistor.

[Power Supply Section]

When the voltage of the storage battery 2 is, e.g., 12 V, the voltage to be supplied to the storage battery 2 can be directly used as the power supply section 6 by appropriately selecting the power supply voltage range of the comparator 9 (to be described later). In this case, a capacitor is used to remove noise, suppress voltage variations in a short time, or stabilize the voltage to be supplied to the comparator 9. If the input section of the power supply section 6 has a rectifier, the rectifier can also serve as the reverse current preventer 4, and the object of the present invention can be achieved.

[Reference Voltage Generator]

As the reference voltage generator 7, e.g., a Zener diode is used, and the Zener voltage is used as a reference voltage. When this Zener voltage is to be shared by a plurality of comparators, the Zener voltage may be divided by a resistor or the like to obtain a desired voltage value.

[Delay Device]

As the delay device 8, an integration circuit formed by combining a resistor and a capacitor is used. The delay time depending on the product of the resistance value and the electrostatic capacitance of the capacitor need be appropriately selected in accordance with the scale of the apparatus and operation conditions.

[Comparator]

As the comparator 9, an operational amplifier is preferably used. For example, in a charge control apparatus for an apparatus having a solar cell panel and a storage battery of 12 V, an operational amplifier which is operated by a single power supply of +12 V is preferable from the viewpoint of simple power supply.

FIRST EMBODIMENT

In this embodiment, the operation of the charge control apparatus will be described in detail on the basis of the circuit diagram shown in FIG. 8.

Figure 8:
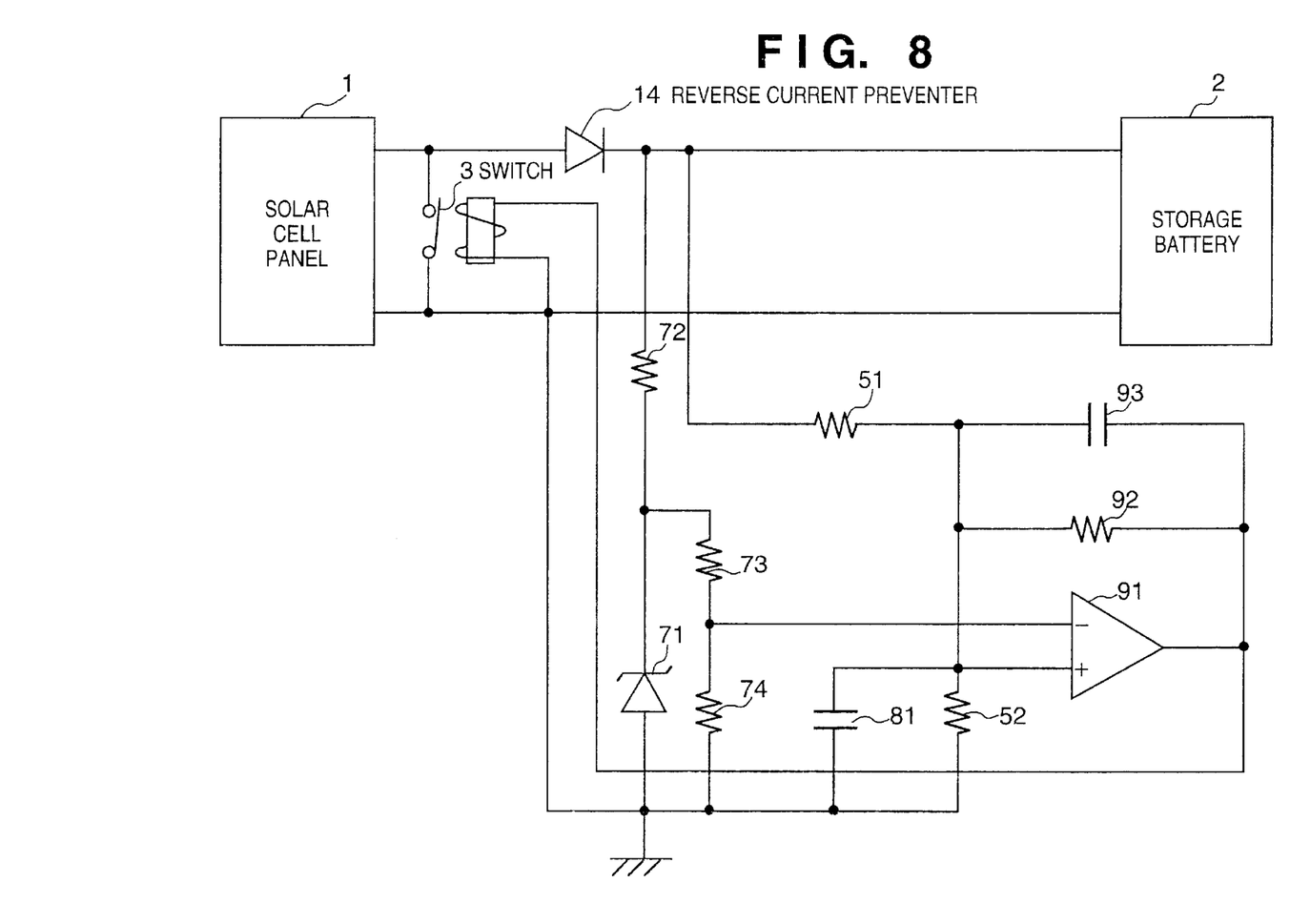
FIG. 8 is a circuit diagram showing the arrangement of a charge control apparatus according to the first embodiment.

In the arrangement shown in FIG. 8, the solar cell panel 1 comprising an amorphous solar cell module (UPM-880 (tradename) available from United Solar Systems Corp. (USSC)) is connected to the lead storage battery 2 having a rated voltage of 12 V through a reverse current preventer 14 comprising a diode. The voltage of the storage battery 2 is input to the comparator 9 constituted by an operational amplifier 91 through the delay device 8 constituted by a resistor 51 and a capacitor 81. As the reference voltage for the comparator 9, the Zener voltage of a Zener diode 71 connected between the reverse current preventer 14 and the storage battery 2 through a resistor 72 for limiting the current is divided by resistors 73 and 74 to obtain a desired value. Resistors 52 and 92 are used to impart hysteresis characteristics to the comparator 9. Note that a capacitor 93 is connected in parallel to the register 92 so to reduce noise, and the capacitor 93 can be deleted from the circuit shown in FIG. 8. A relay is connected as the switch 3. On the basis of the hysteresis characteristics, when the voltage of the storage battery 2 exceeds 14.6 V, the solar cell panel 1 is short-circuited. The short circuit is canceled at a voltage of 13.6 V or less.

In the arrangement shown in FIG. 8, when the storage battery 2 is detached for maintenance or the like, the output from the solar cell panel 1 is short-circuited by the switch 3. Next, since the voltage detected by the voltage detector 5 abruptly lowers, the short-circuited state of the output from the solar cell panel 1 is canceled, and the output from the solar cell panel 1 is short-circuited again by the switch 3. Such short-circuit operation and short-circuit canceling operation are repeated at a period of about 5 ms in an apparatus without the delay device 8. However, in the apparatus of the present invention, which has the delay device 8, this period can be prolonged to about 1 sec.

As described above, according to this embodiment, by inserting the simple delay device 8 constituted by the resistor and the capacitor, load on the switch 3 constituted by the relay can be reduced in maintenance of the apparatus, such as exchange of the storage battery 2, or disconnection. For example, in the apparatus of the present invention, the number of times of opening/closing of the switch 3 due to battery exchange for once a year or maintenance is about 600 times in 10 minutes, though, in the apparatus without the delay device 8, the number of times of opening/closing is 120,000 times in 10 minutes. The number of times of opening/closing can be largely reduced, and the service life of the electric contact of the relay can be largely prolonged.

SECOND EMBODIMENT

In this embodiment, the operation of a charge/discharge control apparatus will be described in detail on the basis of the circuit diagram shown in FIG. 9.

Figure 9:
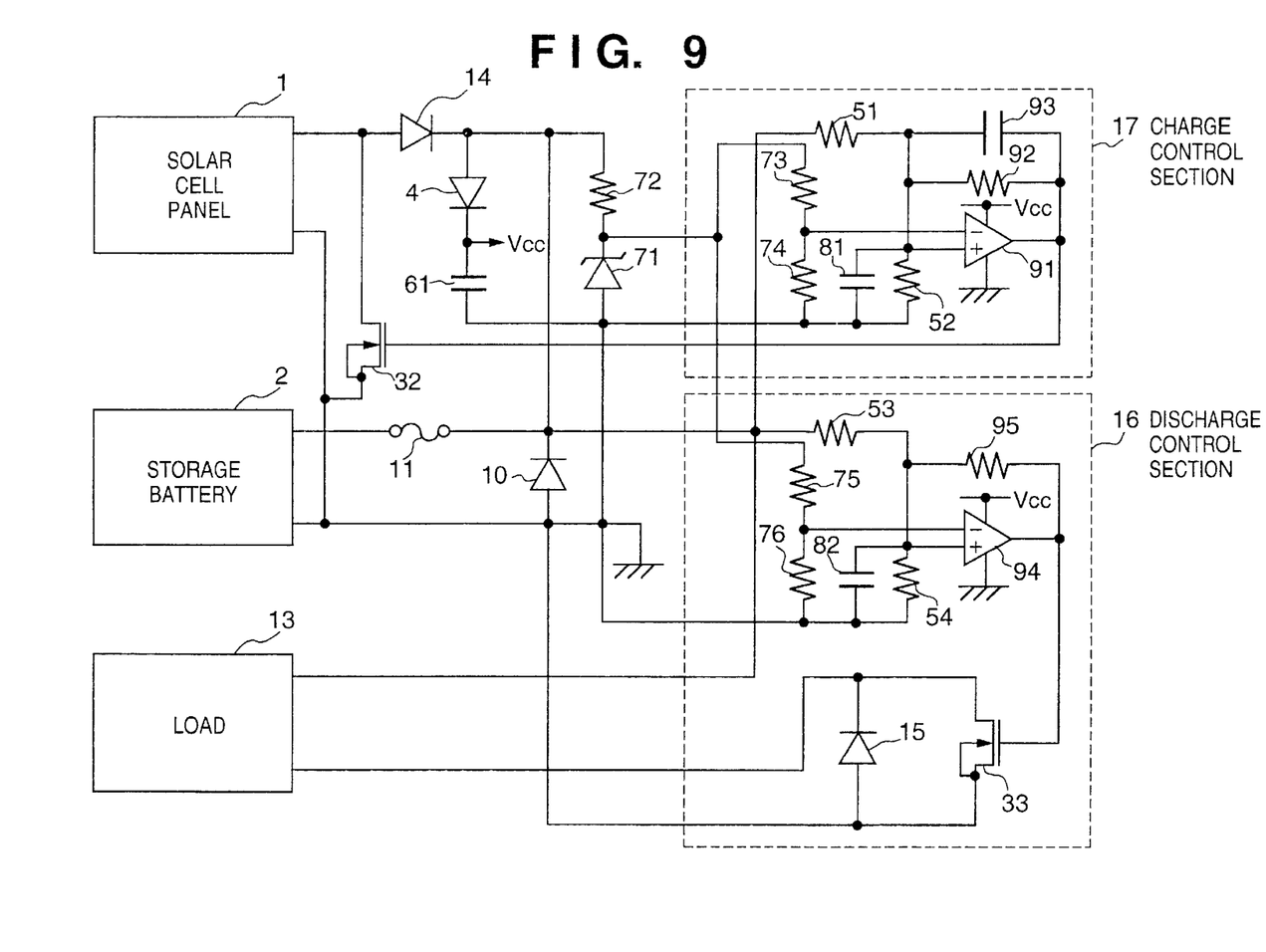
FIG. 9 is a circuit diagram showing the arrangement of a charge/discharge control apparatus according to the second embodiment.

In the arrangement shown in FIG. 9, a solar cell panel 1 formed by parallelly connecting two amorphous solar cell modules (BS-03 (tradename) available from Canon) is connected to a lead storage battery 2 having a rated voltage of 12 V through a reverse current preventer 14 constituted by a diode.

A comparator 9 for a voltage detector 5 and a reference voltage generator 7, and a charge controller 17 and a discharge controller 16, and a delay device 8 have the same arrangements as those in the first embodiment. A power supply section 6 is connected between a reverse current preventer 14 and the storage battery 2 through a reverse current preventer 4 constituted by a diode. A reverse current bypass device 10 as a rectifier diode is connected in parallel to the storage battery 2. A current limiter 11 constituted by a fuse which is changeably mounted on a fuse holder is connected between the cathode of the diode as the reverse current bypass device 10 and the positive terminal of the storage battery 2. A MOSFET 32 is arranged as a switch 3. In this apparatus, the storage battery 2 is connected to a load 13 such as a lamp through the discharge controller 16. When the terminal voltage of the storage battery 2 becomes lower than a predetermined voltage, power supply to the load 13 is stopped by the discharge controller 16. More specifically, an operational amplifier 94 which operates as a hysteresis comparator because of resistors 95 and 54 compares a reference voltage Vr supplied from a voltage divider constituted by resistors 75 and 76 with a voltage Vb supplied in proportion to the voltage of the storage battery 2 from the delay device constituted by a resistor 53 and a capacitor 82. If the voltage of the storage battery 2 is equal to or lower than a first predetermined voltage, a MOSFET 33 is turned off to stop power supply from the storage battery 2 to the load 13. When the voltage of the storage battery 2 becomes equal to or lower than the first predetermined voltage and then rises again to a second predetermined voltage or higher, the MOSFET 33 is turned on to restart power supply from the storage battery 2 to the load 13. A diode 15 connected in parallel between the drain and the source of the MOSFET 33 protects the MOSFET 33 from a surge voltage induced by the inductive load 13. In the arrangement shown in FIG. 9, when the storage battery 2 is disconnected for maintenance or the like, the output from the solar cell panel 1 is short-circuited by the switch 3, as in the first embodiment. Since the voltage detected by the voltage detector 5 abruptly lowers, the short-circuited state of the output from the solar cell panel 1 is canceled, and the output from the solar cell panel 1 is short-circuited again by the switch 3. In the apparatus of this embodiment, by arranging the delay device 8, the opening/closing repeat period can be prolonged, as in the first embodiment. For this reason, the loss and heat in the MOSFET 32 constituting the switch 3 can be reduced.

Figure 10:
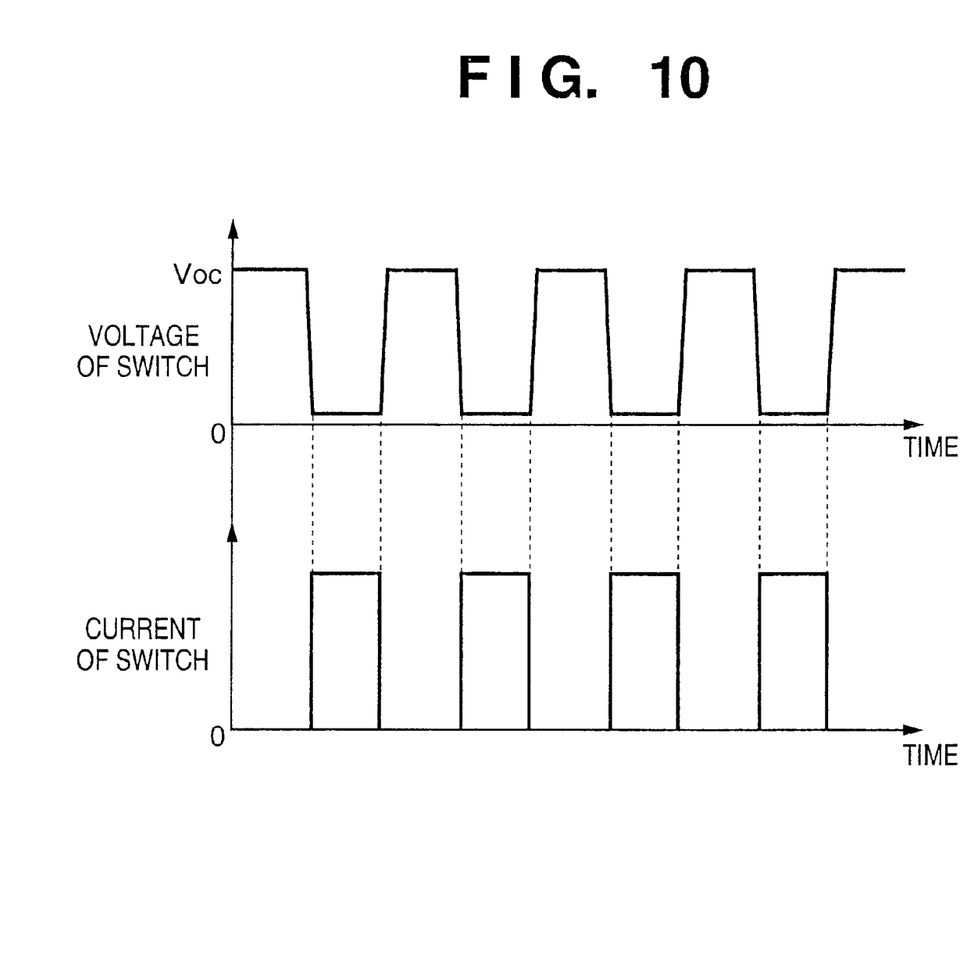
FIG. 10 is a graph showing the relationship between a voltage applied across a switch in the charge/discharge control apparatus shown in FIG. 9 and a current flowing to the switch.

In this embodiment, since the power supply section 6 has the reverse current preventer 4, power stored in a capacitor 61 is not supplied to the reference voltage generator 7 constituted by a Zener diode 71. When the storage battery 2 is not connected, the reference voltage becomes 0 V simultaneously with the short circuit of the output from the solar cell panel 1. For this reason, a relationship as shown in FIG. 10 holds between the voltage applied to the MOSFET 32 and the current flowing to the MOSFET 32, and the loss and heat in the MOSFET 32 can be suppressed. In this embodiment, when the switch 3 is closed, the voltage applied to the MOSFET 32 corresponds to the product of an ON resistance $R_{DS(ON)}$ of the MOSFET 32 and the short circuit current, and this voltage is much lower than the voltage Vmin shown in FIG. 7.

In this embodiment, the reverse current bypass device 10 constituted by a rectifier diode and the current limiter 11 constituted by a fuse are inserted. For this reason, if the storage battery 2 is connected with its polarities being reversed, a short circuit current flows through the reverse current bypass device 10 to cut off the fuse of the current limiter 11. With this operation, reverse voltage application to the control circuit can be prevented. The user can immediately restore the apparatus by exchanging the fuse. A circuit breaker may be used in place of the fuse.

As has been described above, in the charge control apparatus according to the present invention, (a) the delay device is inserted between the voltage detector and the comparator, (b) the reverse current preventer is inserted between the power supply for the comparator and the reference voltage generator to prevent power from the power supply for the comparator from being supplied to the reference voltage generator, and (c) the reverse current bypass device is connected in parallel to the storage battery, and the current limiter is inserted between the storage battery and the reverse current bypass device. An appropriate combination of these three arrangements yields the following effects.

(1) When the change in output signal from the voltage detector is delayed using the delay device, the opening/closing period of the switch can be made long. This reduces the loss and heat in the switching device such as the transistor constituting the switch. In addition, the heat dissipation member or structure of the switching device such as the transistor constituting the switch can be simplified, resulting in cost reduction of the charge control apparatus. When a relay is used as the switch, degradation of and damage to the relay can be prevented, so the service life of the charge control apparatus can be prolonged.

(2) The delay device constituted by a resistor and a capacitor is inserted between the voltage detector and the comparator. With this simple circuit arrangement, effect (1) can be obtained.

(3) To prevent damage to the switch, the storage battery can be detached without disconnecting the solar cell panel from the charge control apparatus. For this reason, maintenance such as exchange of the storage battery is facilitated.

(4) The reverse current preventer is inserted to prevent power supply from the power supply section for the comparator to the reference voltage generator. With this arrangement, power stored in the capacitor, which is connected to the power supply section to stabilize the power supply or remove noise, is prevented from being supplied to the reference voltage generator. After the output from the solar cell panel is short-circuited, the reference voltage immediately becomes 0 V. As a result, in short-circuiting the output from the solar cell panel, the loss and heat in the switching device such as the transistor used for the switch are suppressed, and the heat dissipation member and structure such as a radiator can be simplified.

(5) Since the reverse current bypass device and the current limiter are inserted, even when the storage battery is connected with its polarities being reversed, reverse voltage application to the control circuit and the like can be prevented. Therefore, damage of the charge control apparatus can be prevented.

As many apparently widely different embodiments of the present invention can be made without departing from the spirit and scope thereof, it is to be understood that the invention is not limited to the specific embodiments thereof except as defined in the appended claims.

What is claimed is:

1. A charge control apparatus for controlling charge of a storage battery connected in parallel to a solar cell, comprising:

a reverse current preventer connected between the solar cell and the storage battery to prevent a current from flowing from the storage battery to the solar cell;

a switch connected between the solar cell and said reverse current preventer to be parallel to the solar cell, said switch comprising one of a transistor and an FET;

a voltage detector and a reference voltage generator for generating a reference voltage, both of which are connected between said reverse current preventer and the storage battery to be parallel to the storage battery;

a delay device for delaying an output signal from said voltage detector by a predetermined time;

a controller for comparing the signal delayed by said delay device with a reference signal generated by said reference voltage generator and controlling opening/closing of said switch in accordance with a comparison result;

a power supply unit connected between said reverse current preventer and the storage battery to supply power to said controller; and a rectifier for preventing a current from said power supply unit from flowing to said reference voltage generator.

2. The apparatus according to claim 1, wherein said delay device comprises a resistor and a capacitor.

3. A charge control apparatus for controlling charge of a storage battery connected in parallel to a solar cell, comprising:

a reverse current preventer connected between the solar cell and the storage battery to prevent a current from flowing from the storage battery to the solar cell;

a switch connected between the solar cell and said reverse current preventer to be parallel to the solar cell;

a voltage detector and a reference voltage generator for generating a reference voltage, both of which are connected between said reverse current preventer and the storage battery to be parallel to the storage battery;

a delay device for delaying an output signal from said voltage detector by a predetermined time;

a controller for comparing the signal delayed by said delay device with a reference signal generated by said reference voltage generator and controlling opening/closing of said switch in accordance with a comparison result;

a reverse current bypass device connected between said reverse current preventer and the storage battery at a position close to the storage battery to be parallel to the storage battery; and a current limiter connected between said reverse current bypass device and the storage battery.

4. The apparatus according to claim 3, wherein said delay device comprises a resistor and a capacitor.

5. The apparatus according to claim 3, wherein said switch comprises a relay.

6. The apparatus according to claim 3, wherein said switch comprises one of a transistor and an FET.

7. A photovoltaic power generation apparatus having a solar cell, a storage battery connected in parallel to the solar cell, and a charge control unit for controlling charge of the storage battery, wherein said charge control unit comprises:

a reverse current preventer connected between the solar cell and the storage battery to prevent a current from flowing from the storage battery to the solar cell;

a shunt connected between the solar cell and said reverse current preventer to be parallel to the solar cell, said shunt comprising one of a transistor and an FET;

a voltage detector and a reference voltage generator for generating a reference voltage, both of which are connected between said reverse current preventer and the storage battery to be parallel to the storage battery;

a delay device for delaying an output signal from said voltage detector by a predetermined time;

a controller for comparing the signal delayed by said delay device with a reference signal generated by said reference voltage generator and controlling opening/closing of said shunt in accordance with a comparison result;

a power supply unit connected between said reverse current preventer and the storage battery to supply power to said controller; and a rectifier for preventing a current from said power supply unit from flowing to said reference voltage generator.

8. The apparatus according to claim 7, wherein said delay device comprises a resistor and a capacitor.

9. The apparatus according to claim 7, further comprising:

a switch connected between the storage battery and a load; and a discharge control unit for controlling an opening/closing operation of said switch to control discharge of the storage battery.

10. A photovoltaic power generation apparatus having a solar cell, a storage battery connected in parallel to the solar cell, and a charge control unit for controlling charge of the storage battery, wherein said charge control unit comprises:

a reverse current preventer connected between the solar cell and the storage battery to prevent a current from flowing from the storage battery to the solar cell;

a shunt connected between the solar cell and said reverse current preventer to be parallel to the solar cell;

a voltage detector and a reference voltage generator for generating a reference voltage, both of which are connected between said reverse current preventer and the storage battery to be parallel to the storage battery;

a delay device for delaying an output signal from said voltage detector by a predetermined time;

a controller for comparing the signal delayed by said delay device with a reference signal generated by said reference voltage generator and controlling opening/closing of said shunt in accordance with a comparison result;

a reverse current bypass device connected between said reverse current preventer and the storage battery at a position close to the storage battery to be parallel to the storage battery; and a current limiter connected between said reverse current bypass device and the storage battery.

11. The apparatus according to claim 10, wherein said delay device comprises a resistor and a capacitor.

12. The apparatus according to claim 10, wherein said shunt comprises a relay.

13. The apparatus according to claim 10, wherein said shunt comprises one of a transistor and an FET.

14. The apparatus according to claim 10, further comprising:

a switch connected between the storage battery and a load; and a discharge control unit for controlling an opening/closing operation of said switch to control discharge of the storage battery.

* * * * *

UNITED STATES PATENT AND TRADEMARK OFFICE
CERTIFICATE OF CORRECTION

PATENT NO. : 6,051,954
DATED : April 18, 2000
INVENTOR(S) : Yoshitaka Nagao et al.

It is certified that error appears in the above-identified patent and that said Letters Patent is hereby corrected as shown below:

ON TITLE PAGE AT [56] ATTORNEYS

"Fitzpatrick, Cella Harper & Scinto" should read --Fitzpatrick, Cella, Harper & Scinto"--.

ON TITLE PAGE AT [56] REFERENCES CITED, U.S. PATENT DOCUMENTS.

Delete the following:

```
"3,596,218   7/1971    Layton..............335/17
 3,596,219   7/1971    Erickson............335/17
 4,466,071   8/1984    Russell, Jr. .......364/528.28
 4,658,322   4/1987    Rivera..............361/37
 4,847,850   7/1989    Kafka et al. .......372/71
 4,878,144   10/1989   Nebon...............361/96
 4,931,894   6/1990    Legatti.............361/45
 5,121,282   6/1992    White...............361/42
 5,185,684   2/1993    Beihoff et al. .....361/45
 5,185,685   2/1993    Tennies et al. .....361/45
 5,185,686   2/1993    Hansen et al. ......361/45
 5,185,687   2/1993    Beihoff et al. .....361/45
 5,206,596   4/1993    Beihoff et al. .....324/536
 5,208,542   5/1993    Tennies et al. .....324/544
 5,223,682   6/1993    Pham et al. ........218/63
 5,224,006   6/1993    MacKenzie et al. ...361/45
 5,245,498   9/1993    Uchida et al. ......361/47
 5,307,230   4/1994    MacKenzie..........361/96
 5,359,293   10/1994   Boksiner et al. ....324/544
 5,420,740   5/1995    MacKenzie et al. ...361/45
```

UNITED STATES PATENT AND TRADEMARK OFFICE
CERTIFICATE OF CORRECTION

PATENT NO. : 6,051,954
DATED : April 18, 2000
INVENTOR(S) : Yoshitaka Nagao et al.

It is certified that error appears in the above-identified patent and that said Letters Patent is hereby corrected as shown below:

```
5,432,455   7/1995   Blades...............324/536
5,434,509   7/1995   Blades...............324/536
5,452,223   9/1995   Zuercher et al.......324/102
5,453,723   9/1995   Fello et al..........335/18
5,459,630   10/1995  MacKenzie et al. ....324/520
5,483,211   1/1996   Carrodus et al. .....335/18
5,493,278   2/1996   Mackenzie et al. ....340/638
5,510,946   4/1996   Franklin.............361/56
5,519,561   5/1996   Mrenna et al. .......361/105
5,546,266   8/1996   Mackenzie et al. ....361/93
5,550,751   8/1996   Russell..............364/528.28
5,561,605   10/1996  Zuercher et al. .....702/64
5,578,931   11/1996  Russell et al. ......324/536
5,590,012   12/1996  Dollar, II...........361/113
5,600,526   2/1997   Russell et al. ......361/65
5,659,453   8/1997   Russell et al. ......361/93.1
5,831,500   11/1998  Turner et al. .......335/17".
```

Signed and Sealed this

Tenth Day of April, 2001

Attest:

NICHOLAS P. GODICI

Attesting Officer         Acting Director of the United States Patent and Trademark Office